(12) United States Patent
Santangelo et al.

(10) Patent No.: US 11,538,903 B2
(45) Date of Patent: Dec. 27, 2022

(54) CHARGE-BALANCE POWER DEVICE, AND PROCESS FOR MANUFACTURING THE CHARGE-BALANCE POWER DEVICE

(71) Applicant: STMicroelectronics S.r.l., Agrate Brianza (IT)

(72) Inventors: Antonello Santangelo, Belpasso (IT); Giuseppe Longo, Catania (IT); Lucio Renna, Acireale (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 70 days.

(21) Appl. No.: 16/945,220

(22) Filed: Jul. 31, 2020

(65) Prior Publication Data

US 2021/0036104 A1 Feb. 4, 2021

(30) Foreign Application Priority Data

Jul. 31, 2019 (IT) .................... 102019000013416

(51) Int. Cl.
*H01L 29/06* (2006.01)
*H01L 21/265* (2006.01)
(Continued)

(52) U.S. Cl.
CPC ........ *H01L 29/0634* (2013.01); *H01L 21/266* (2013.01); *H01L 21/26513* (2013.01);
(Continued)

(58) Field of Classification Search
CPC ........... H01L 29/0634; H01L 21/26513; H01L 21/26586; H01L 21/266; H01L 29/1095;
(Continued)

(56) References Cited

U.S. PATENT DOCUMENTS 7,344,953 B2 3/2008 Hecht et al.
2006/0289928 A1 12/2006 Takaya et al.
(Continued)

FOREIGN PATENT DOCUMENTS

EP 1 994 566 B1 1/2018
JP 2006-93193 A 4/2006

OTHER PUBLICATIONS

"GaN Technology—Why GaN-on-Si?" downloaded from https://www.transphormusa.com/en/gan-technology/ on Jul. 28, 2020, 5 pages.
(Continued)

*Primary Examiner* — Mohammad M Hoque
(74) *Attorney, Agent, or Firm* — Seed Intellectual Property Law Group LLP

(57) ABSTRACT

A charge-balance power device includes a semiconductor body having a first conductivity type. A trench gate extends in the semiconductor body from a first surface toward a second surface. A body region has a second conductivity type that is opposite the first conductivity type, and the body region faces the first surface of the semiconductor body and extends on a first side and a second side of the trench gate. Source regions having the first conductivity type extend in the body region and face the first surface of the semiconductor body. A drain terminal extends on the second surface of the semiconductor body. The device further comprises a first and a second columnar region having the second conductivity, which extend in the semiconductor body adjacent to the first and second sides of the trench gate, and the first and second columnar regions are spaced apart from the body region and from the drain terminal.

26 Claims, 9 Drawing Sheets

(51) Int. Cl.
   H01L 21/266   (2006.01)
   H01L 29/10    (2006.01)
   H01L 29/66    (2006.01)
   H01L 29/78    (2006.01)

(52) U.S. Cl.
   CPC .... *H01L 21/26586* (2013.01); *H01L 29/1095* (2013.01); *H01L 29/66734* (2013.01); *H01L 29/7813* (2013.01)

(58) Field of Classification Search
   CPC ........... H01L 29/66734; H01L 29/7813; H01L 29/42368; H01L 29/7827; H01L 29/0684; H01L 29/66666
   USPC ........................................................ 257/330
   See application file for complete search history.

(56) References Cited

U.S. PATENT DOCUMENTS

| | | | |
|---|---|---|---|
| 2008/0150073 | A1 | 6/2008 | Willmeroth et al. |
| 2010/0224932 | A1* | 9/2010 | Takaya .............. H01L 29/66734 257/E21.334 |
| 2013/0307059 | A1 | 11/2013 | Weis |
| 2013/0309824 | A1 | 11/2013 | Na |
| 2015/0129957 | A1* | 5/2015 | Takaya ................ H01L 29/7827 257/330 |
| 2017/0011952 | A1* | 1/2017 | Saito ................... H01L 29/0696 |
| 2017/0012122 | A1* | 1/2017 | Takaya .............. H01L 29/66068 |
| 2017/0018643 | A1* | 1/2017 | Takaya ................ H01L 29/0696 |
| 2017/0077292 | A1 | 3/2017 | Hommi et al. |
| 2018/0240906 | A1* | 8/2018 | Tsujimura ........... H01L 29/4238 |
| 2019/0067420 | A1* | 2/2019 | Takaya ................ H01L 29/0623 |
| 2019/0109187 | A1* | 4/2019 | Misumi ............. H01L 29/42368 |

OTHER PUBLICATIONS

Ho et al., "Controlled nanoscale doping of semiconductors via molecular monolayers," *Nature Materials* 7:62-67, Jan. 2008, 16 pages.

Infineon, "MOSFET—OptiMOS™ 5 Power-Transistor, 150 V," BSC093N15NS5, Final Data Sheet, Jan. 27, 2020, 10 pages.

Miyake, "Diffusion of Boron into Silicon from Borosilicate Glass Using Rapid Thermal Processing," *J. Electrochem. Soc.* 138(10):3031-3039, Oct. 19, 1991.

Ono et al., "Development of 600V-class trench filling SJ-MOSFET with SSRM analysis technology," 21$^{st}$ International Symposium on Power Semiconductor Devices & IC's, Barcelona, Spain, Jun. 14-18, 2009, pp. 303-306.

Sakakibara et al., "600V-class Super Junction MOSFET with High Aspect Ratio P/N Columns Structure," Proceedings of the 20$^{th}$ International Symposium on Power Semiconductor Devices & IC's, Orlando, FL, USA, May 18-22, 2008, pp. 299-302.

Shibata et al., "200V Trench Filling Type Super Junction MOSFET with Orthogonal Gate Structure," Proceedings of the 19$^{th}$ International Symposium on Power Semiconductor Devices & ICs, Jeju, Korea, May 27-30, 2007, pp. 37-40.

Sugi et al., "Super Junction MOSFETs above 600V with Parallel Gate Structure Fabricated by Deep Trench Etching and Epitaxial Growth," Proceedings of the 20$^{th}$ International Symposium on Power Semiconductor Devices & IC's, Orlando, FL, USA, May 18-22, 2008, pp. 165-168.

Tamaki et al., "Vertical Charge Imbalance Effect on 600 V-class Trench-Filling Superjunction Power MOSFETs," Proceedings of the 23$^{rd}$ International Symposium on Power Semiconductor Devices & IC's, San Diego, CA, USA, May 23-26, 2011, pp. 308-311.

Udrea et al., "Superjunction Power Devices, History, Development, and Future Prospects," *IEEE Transactions on Electron Devices* 64(3):713-727, Mar. 2017.

Weber et al., "A New Optimized 200V Low On-Resistance Power FLYMOSFET," Proceedings of the 20$^{th}$ International Symposium on Power Semiconductor Devices & IC's, Orlando, FL, USA, May 18-22, 2008, pp. 149-152.

Williams et al., "The Trench Power MOSFET: Part 1—History, Technology, and Prospects," *IEEE Transactions on Electron Devices* 64(3):674-691, Mar. 2017.

Zulauf et al., "$C_{oss}$ Losses in Silicon Superjunction MOSFETs across Constructions and Generations," Proceedings of the 30$^{th}$ International Symposium on Power Semiconductor Devices & ICs, Chicago, IL, USA, May 13-17, 2018, pp. 136-139.

\* cited by examiner

CHARGE-BALANCE POWER DEVICE, AND PROCESS FOR MANUFACTURING THE CHARGE-BALANCE POWER DEVICE

BACKGROUND

Technical Field

The present disclosure relates to a charge-balance power device and to a process for manufacturing the charge-balance power device.

DESCRIPTION OF THE RELATED ART

The disclosure regards, in particular but not exclusively, a vertical-conduction power device (for example, a power MOS device or a device of the IGBT (Insulated-Gate Bipolar Transistor) type, or a device of the BJT (Bipolar Junction Transistor) type, or bipolar diodes or Schottky diodes, and the ensuing description refers to this field of application with the sole purpose of simplifying exposition thereof.

Vertical-current MOSFET devices are used in various applications, which typically require low dissipation of heat even when they operate in conditions of high current. In practice, the device should present low on-state source-to-drain resistance (i.e., low Rdson), at the same time being able to withstand a high reverse-biasing voltage (high BVdss).

In vertical-current devices, the requisites for the two parameters referred to above (Rdson and BVdss) conflict with one another as to obtain a high reverse voltage it is generally believed necessary to increase the thickness of the semiconductor body that withstands said current (i.e., by increasing the thickness of the epitaxial layer grown on the substrate) and/or increase the resistivity of the epitaxial layer itself. In either case, there is an increase in Rdson as an increase in thickness entails a longer path of the current in the on state, whereas a higher resistivity of the epitaxial layer leads to a higher resistance to the flow of current.

To reduce the on-state source-to-drain resistance, it is possible to use a column structure that enables increase of the body-drain perimeter so as to be able to exploit the entire volume of the epitaxial layer. This technique makes it possible to use a more heavily doped epitaxial layer, therefore one having a lower resistivity, given the same values of reverse voltage, thus reducing the component of Rdson due to the epitaxial layer (hereinafter defined as on-state epitaxial resistance Repi).

This type of structure envisages the creation of trench-gate terminals, separated from one another by columns of a P type, as illustrated, for example, in FIG. 1.

In particular, FIG. 1 relates to an N-channel device 1 having an epitaxial layer 3a grown on a substrate 3b, both being of an N type; the epitaxial layer 3a houses columns 2 of a P type underneath body regions 4. The body regions 4 are of a P type and include a portion with increased doping, P+, to favor electrical contact. Source regions 5 are formed in electrical contact with the body regions 4, while gate regions 6 extend in depth in the epitaxial layer 3a, between body regions 4. A drain metallization extends on the side of the substrate 3b opposite to the side on which the epitaxial layer 3a extends.

The gate regions 6 comprise a metallization region 6a completely surrounded by a respective gate-oxide layer 6b. A metallization region 8 electrically connects the source regions 5 and the body regions 4 (in particular, the portion 4a), and is electrically insulated from the gate regions 6 via the gate-oxide layer 6b.

In devices with columnar structure, it is possible to obtain charge-balance or charge compensation between the dopant of the columns 2, of a P type, and the charge of the epitaxial layer 3a, of an N type, so that the total charge of the columns 2 will be equal and of opposite sign with respect to the total charge of the epitaxial layer 3a. The charge-balance condition alone is not sufficient. Additionally, the charge of the epitaxial layer 3a (N), which is equal to the charge of the columns 2(P), should be contained within certain values (which depend upon the 3D structure of the device). These conditions entail complete depletion of the free carriers both in the epitaxial layer 3a and in the columns 2 so as to provide an area without carriers, which, behaving as an insulating layer, enables high values of reverse voltage (breakdown voltage), with an electrical extension field with a profile that is practically uniform both in magnitude and in direction throughout the region comprising the epitaxial layer 3a and the columns 2. In particular, it is possible to bias the device so that the electrical field will be close to the critical electrical field, which is the maximum electrical field that a P-N junction can withstand at the interface and beyond which the process of avalanche conduction is triggered (breakdown).

Using the concept of charge-balance, it is thus possible to choose a high concentration of dopant in the epitaxial layer 3a appropriately balanced by the dopant in the columns. There exist, however, limits to this choice, as it is important to calibrate the inter-column distance to guarantee complete depletion of the entire epitaxial region, including the columns 2.

Another type of charge-balance device can be obtained by implementing a MOS capacitor instead of a column having a doping of a P type. FIGS. 2A and 2B show respective technical solutions for implementing a superjunction VDMOS 1' and 1", respectively. Elements illustrated in FIGS. 2A and 2B that are common to those of FIG. 1 are designated by the same reference numbers and will not be described any further hereinafter.

Similarly to a PN junction, a MOS capacitor induces in the epitaxial layer 3a a depleted region when it is biased negatively with respect to the biasing of the epitaxial layer. The fixed positive charges of the ionized donor atoms in the depletion region counterbalance the negative charges (electrons) of the conductive field plate. Unlike the case of the charge-balance of a PN junction, in a superjunction VDMOS, a capacitor with buried electrode 11 (FIG. 2A) is used to induce depletion in the drift region of the epitaxial layer 3a. This electrode 11 is typically provided buried underneath the gate metallization 6a, completely surrounded by an oxide layer 6b (solution likewise known as "split gate trench"); or using a buried field plate 14 in a double-trench design 16 (solution illustrated in FIG. 2B).

In both implementations of FIGS. 2A and 2B, the total charge of the epitaxial layer 3a should meet the charge-balance criterion; i.e., the drift region should be completely depleted before the vertical junction formed by the body, the epitaxial layer, and the substrate (reference numbers 4, 3a, and 3b, respectively) reaches its critical electrical field and a transport of carriers is set up by the avalanche effect.

Moreover, in both cases represented in FIGS. 2A and 2B, the polysilicon electrodes 11 and 14 are electrically connected to the lowest potential, i.e., the source potential. In the solution of FIG. 2A, this aspect is particularly complex from the standpoint of the manufacturing process. The gate electrode and the field plate should coexist within the same trench but should be electrically insulated. In addition, it is also important for the gate electrode to be intermittently interrupted to make the contact on the field plate. This renders the processes and reliability of the entire system complicated.

Unlike the superjunction with PN junction, where the charge of a P type should satisfy the charge-balance criteria, in the MOS-induced superjunction, the only requisite is that the insulation of the field plate withstands the full clamping voltage of the device through the dielectric at the bottom of the trench, a criterion that fixes the oxide thicknesses in the range of a few micrometers.

Consequently, it is important to pay particular attention to prevent thinning-out of the bottom corners of the trench and to prevent formation of defects induced by the stress along the edges and the bottom corners of the trench.

In the example of prior art with the field plate, the horizontal dimensions of the trench would increase as the breakdown voltage increases, while the internal polysilicon electrode imposes a further dimensional increase.

In conclusion, the trench comes to assume horizontal dimensions that exceed the part of the epitaxial comprised between the trenches. This obviously causes a greater consumption of the horizontal area of the final device, an area that does not contribute to conduction and that, from this standpoint, is to be considered parasitic.

BRIEF SUMMARY

The solution of FIG. 2A is moreover limited by the components of parasitic capacitance that are set up between the buried field plate and the underlying drain terminal (this capacitance is charged and discharged at each switching-on and switching-off of the device, with obvious associated drawbacks in terms of power consumption and delay).

In conclusion, the need is felt for an alternative solution to the known solutions that will be able to overcome the aforementioned drawbacks so as to reduce further the on-state source-drain resistance (Rdson), without having a negative impact on the breakdown voltage.

According to the present disclosure, a charge-balance power device and a process for manufacturing the charge-balance power device are provided.

In one or more embodiments, a charge-balance power device is provided that includes a semiconductor body having a first conductivity type. The semiconductor body has a first surface and a second surface opposite to one another along a first direction. A trench gate extends in the semiconductor body from the first surface towards the second surface. A body region has a second conductivity type opposite to the first conductivity type, and the body region faces the first surface of the semiconductor body and extends on a first side and a second side of the trench gate. The first and second sides are opposite to one another along a second direction that is transverse to the first direction. Source regions having the first conductivity type extend in the body region and face the first surface. A drain terminal extends on the second surface of the semiconductor body. First and second columnar regions having the second conductivity type extend in the semiconductor body adjacent to the first and said second sides, respectively, of the trench gate, and the first and second columnar regions are spaced apart from the body region and from the drain terminal.

In one or more embodiments, a process for manufacturing a charge-balance power device is provide that includes: forming a trench gate in a semiconductor body having a first conductivity type and a first surface and a second surface opposite to one another along a first direction, the trench gate extending from the first surface towards the second surface; forming a body region in the semiconductor body on a first and a second side of said trench gate, the first and second sides of the trench gate opposite to one another along a second direction that is transverse to the first direction, the body region facing the first surface of the semiconductor body and having a second conductivity type opposite to the first conductivity type; forming, in the body region and facing the first surface, source regions that have the first conductivity type; forming a drain terminal on the second surface of the semiconductor body; and forming, in the semiconductor body, adjacent to said first and second sides of the trench gate, a first and a second columnar region having the second conductivity type, the first and second columnar regions spaced apart from the body region and from the drain terminal.

In one or more embodiments, a device is provided that includes a substrate having a first conductivity type. The substrate has opposite first and second surfaces. An epitaxial layer is disposed on the first surface of the substrate, and the epitaxial layer has the first conductivity type. A trench gate extends into the epitaxial layer toward the substrate. First and second columnar regions are disposed on opposite sides of the trench gate in the epitaxial layer and spaced apart from the first surface of the substrate. The first and second columnar regions have a second conductivity type opposite the first conductivity type.

BRIEF DESCRIPTION OF THE SEVERAL VIEWS OF THE DRAWINGS

For a better understanding of the disclosure, embodiments thereof are now described, purely by way of non-limiting example and with reference to the attached drawings, wherein.

DETAILED DESCRIPTION

Figure 3A:
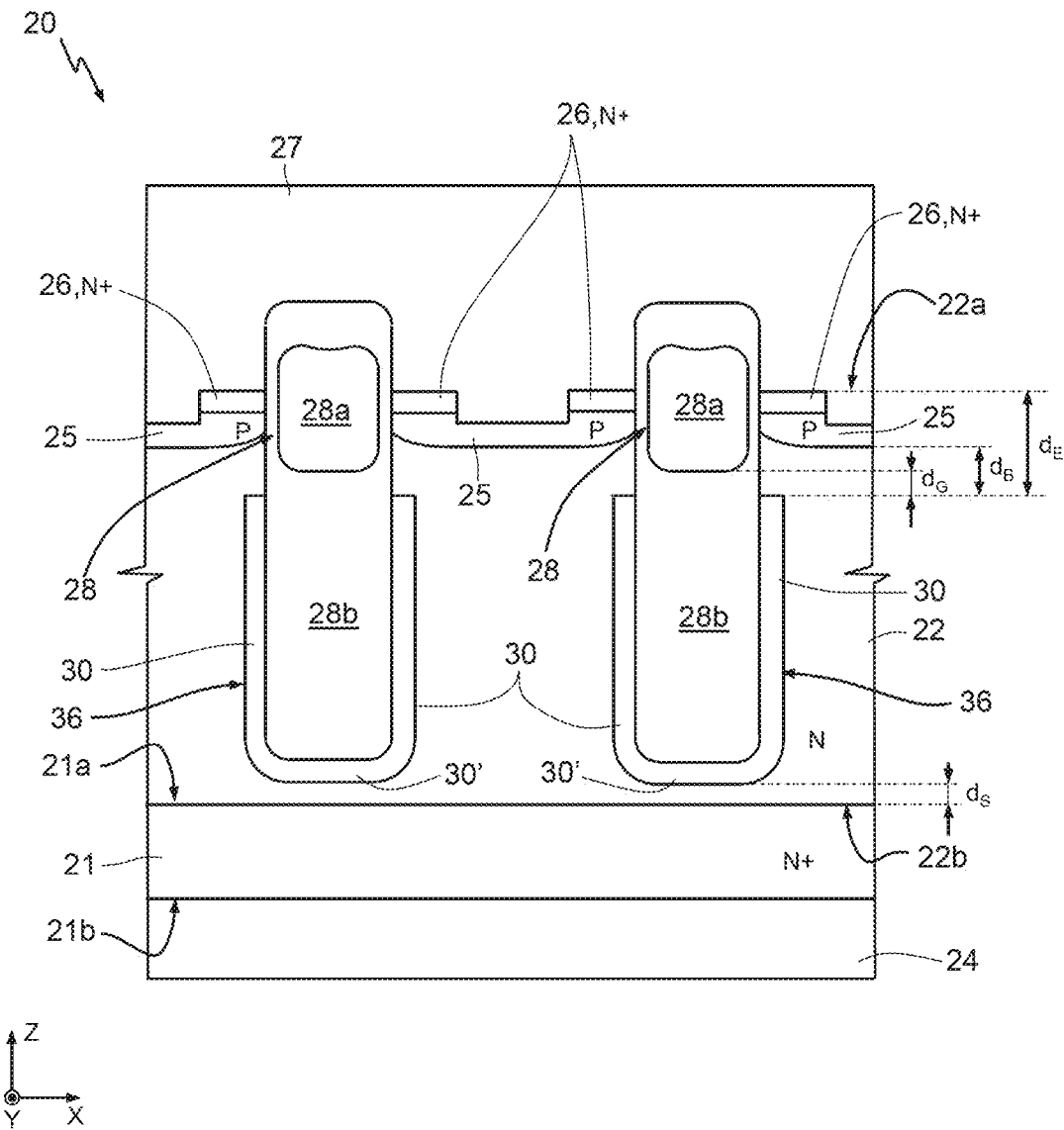
FIG. 3A is a cross-section view, along the cross-section line A-A of FIG. 3B, of an example of an embodiment of a MOS device according to the disclosure.

FIG. 3A shows, in a triaxial system of mutually orthogonal axes X, Y, Z (Cartesian system), a portion of a MOS device 20 of the charge-compensation type.

The MOS device 20 comprises an epitaxial layer 22 (e.g., of silicon) of an N type overlying a substrate 21, of an N+ type (which is, for example, also of silicon). The epitaxial layer 22 extends along the direction of the axis Z, between a top surface or face 22a and a bottom surface or face 22b, opposite to one another along Z. The thickness, measured in the direction Z between the top surface 22a and the bottom surface 22b, of the epitaxial layer 22 is, for example, comprised between 6 μm and 13 μm. Doping of the epitaxial layer 22 (e.g., in the range $5·10^{16}$ cm$^{-3}$ to $1.5·10^{16}$ cm$^{-3}$) is designed so as to bestow the epitaxial layer 22 a resistivity comprised between 0.15 and 0.35 Ω·cm.

The bottom surface 22b is in direct contact with a top face 21a of the substrate 21, while a bottom face 21b of the substrate 21 (opposite to the face 21a along Z) is in contact with a drain metallization 24. Therefore, the substrate 21 and the drain metallization 24 together form a drain terminal of the MOS device 20. The MOS device 20 is therefore a vertical-channel device.

The MOS device 20 further comprises one or more gate regions 28 (two gate regions 28 are illustrated by way of example in FIG. 3A) of a trench type. In particular, the gate regions 28 each comprise a gate conductive region 28a completely surrounded by a respective gate dielectric layer 28b. The gate conductive region 28a may be, for example, of metal material, or of doped polysilicon. The gate dielectric layer 28b is, for example, an oxide, such as $SiO_2$.

Each trench that houses the respective gate region 28 has, by way of example, a depth, measured along the direction Z starting from the surface 22a, comprised between 4 and 10 μm and a width, measured along the direction X, comprised between 0.5 and 1.5 μm. The distance (also known as pitch) between a gate region 28 and the immediately subsequent (or previous) gate region 28 along the direction X is, for example, comprised between 1.2 μm and 4 μm.

In each gate region 28, the gate dielectric layer 28b extends in depth (along Z) in the epitaxial layer 22 so as to completely cover the walls and the bottom of the respective trench. Each gate conductive region 28a extends in depth (along Z) in the epitaxial layer 22 and is electrically insulated from the epitaxial layer 22 by the gate dielectric layer 28b. The thickness of each gate conductive region 28a, measured along the direction Z, is comprised, for example, between 0.4 and 1.1 μm. Each gate conductive region 28a extends between a top side thereof and a bottom side thereof; in an embodiment, the top side of each gate conductive region 28a is aligned to the surface 22a, so that the bottom side of each gate conductive region 28a reaches a depth, in the respective trench, comprised between 0.4 and 1.1 μm starting from the surface 22a.

Body regions 25, of a P type, extend within the epitaxial layer 22 alongside (along the direction X) each gate region 28 and facing the top surface 22a of the epitaxial layer 22. The maximum depth, along the direction Z, reached by each body region 25 in the epitaxial layer 22, is equal to or less than the depth reached by each gate conductive region 28a (i.e., in a non-limiting example, equal to or less than 0.4 to 1.1 μm).

The body regions 25 moreover house, in a per se known manner, source regions 26, of an N type, facing the top surface 22a.

An electrical-contact region (e.g., a metallization region) 27 extends over the body regions 25 and the source region 26, in electrical contact therewith, to bias them during use.

Columnar regions 30, of a P type, extend in the epitaxial layer 22 so as to face laterally each gate region 28. In other words, the columnar regions 30 extend along sides, opposite to one another along the direction X, of each gate region 28. In particular, the columnar regions 30 border on, and are adjacent to, the gate dielectric layer 28b of the respective gate region 28. In the active area (i.e., in the area in which, in use, the conductive channel is formed), the columnar regions 30 extend at a distance (along Z) both from the overlying body regions 25 and from the underlying drain terminal.

The columnar regions 30 are, in particular, mutually specular with respect to an axis of symmetry passing through the geometrical center of the gate region 28.

Each columnar region 30 has a charge in the range of $0.5·10^{12}$ and $5·10^{12}$ cm$^{-2}$, designed to compensate locally the doping of the epitaxial layer 22.

Furthermore, according to the embodiment of FIG. 3A, the aforesaid columnar regions 30 are connected to one another at the bottom of the gate region 28 by a region 30' of a P type. Also the regions 30' extend at a distance from the underlying drain terminal, so that the columnar regions 30 and the connection portions 30' are completely contained within the epitaxial layer 22. Each connection region 30' has, for example, a doping value equal to the doping of the columnar regions 30. The ensemble of the columnar regions 30 and of the connection region 30' is also designated, in what follows in the figures, by the reference number 36.

According to the embodiment of FIG. 3A, each gate region 28a is partially surrounded by a respective region 36 having a conductivity (P) opposite to the conductivity (N) of the epitaxial layer. In this regard, it may be noted that the entire region 36 is, in the view along the XZ plane of FIG. 3A in correspondence of the active area, at a distance both from the body regions 25 and from the substrate 21 (which, from an electrical standpoint, forms part of the drain terminal).

The distance $d_B$ in FIG. 3A denotes the distance (measured along Z) between each columnar region 30 and the body region 25 above it. The distance $d_E$ in FIG. 3A denotes the distance (measured along Z) between each columnar region 30 and the top surface 22a of the epitaxial layer 22. The distance $d_G$ in FIG. 3A represents the gap (measured along Z) between each columnar region 30 and the bottom side of the gate conductive region 28a. By way of example, $d_E$ is comprised in the range between 1 μm and 2 μm, and $d_G$ is comprised in the range between 0.4 μm and 0.8 μm. Consequently, the distance $d_B$ ranges from 0.6 μm to 1.2 μm. It may be noted that the distance $d_B$ can vary with respect to the aforementioned values on account of a non-uniform concentration of the dopants of the body, which bestow the body region with a non-uniform shape, with a depth that increases in distance further from the gate trench. In particular, this distance $d_B$ may be greater than 1.2 μm in the case where the body has a conformation that presents a recess above the respective columnar region 30. For instance, $d_B$ may be comprised between 0.6 μm and 1.8 μm.

If the distance $d_G$ were equal to 0, or if the region 30 were, in the active area, in contact with the body 25, then the MOSFET (which could conduct only in conditions of drain biasing higher than zero) would cease to exist. This occurs because the inversion region of an N type that is formed in the body 25 as a result of the positive biasing of the gate conductive region 28a and that starts from the source region 26 would not end up in a region of an N type (a fact that would guarantee electrical continuity), but in a region of a P type (namely, the region 30), no longer under electrostatic control by the gate conductive region 28a.

The distance $d_B$ (also measured along Z) between each columnar region 30 and the overlying body region 25 has a value equal to or higher than the value of $d_G$.

The distance, identified in FIG. 3A by the reference ds, between each connection region 30' (bottom of the respective region 36) and the top surface 21a of the substrate 21 is comprised between 0.4 μm and 1 μm. The distance ds is measured along the axis Z. The choice of the value of the distance ds is, in general, made so as to guarantee, in use, depletion of the region of the epitaxial layer 22 that is comprised between each connection region 30' and the substrate 21 (besides, as will be evident to the person skilled in the art, if the region 36 were too close to the substrate 21—or drain terminal—there would be an undesirable drastic drop in the breakdown value).

However, outside the active area, an electrical connection from region 36 to a reference potential should be made, e.g. to ground, in order to allow constant repopulation of charge carriers (holes) in region 36. For this purpose, an electrical connection between region 36 and the body 25 region can be provided at a peripheral portion of the MOS device 20 outside the active area, i.e. in a region where there is no current flow between source and drain during use.

Figure 3B:
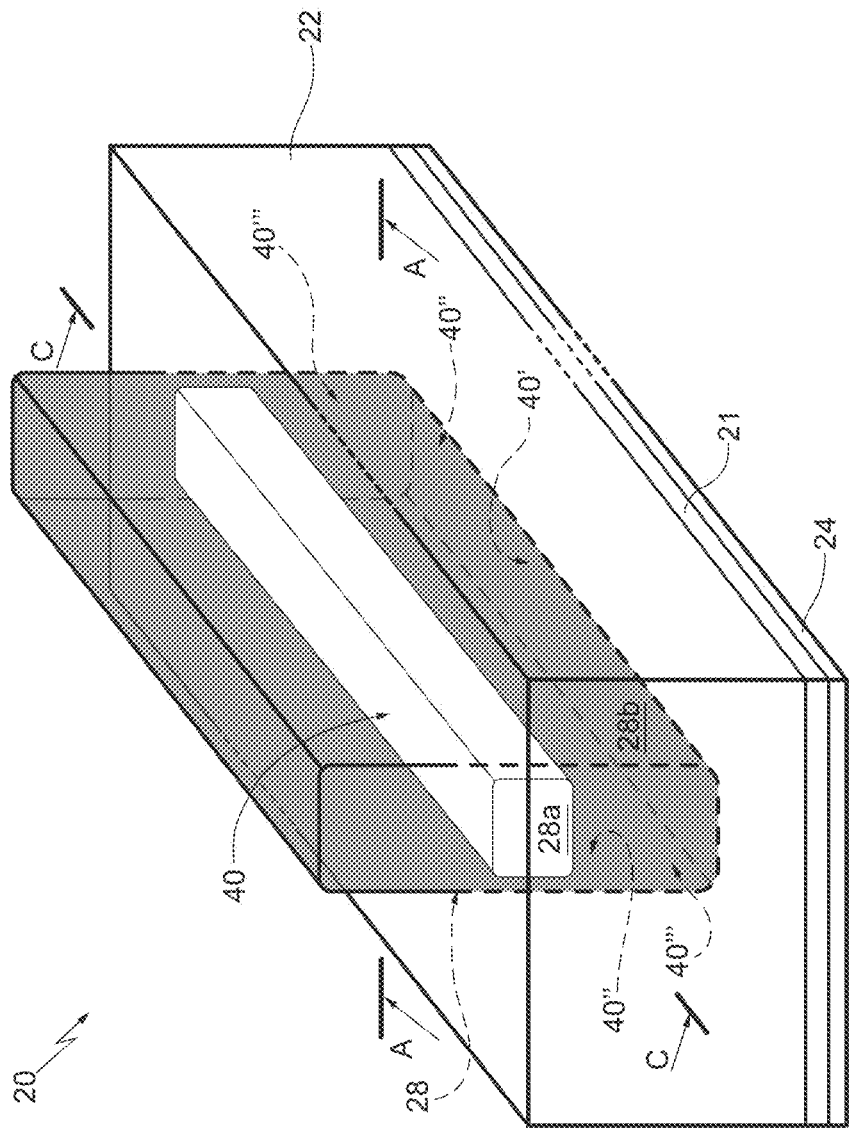
FIG. 3B is a perspective view of the MOS device of FIG. 3A, in which only certain elements useful for the understanding of embodiments of the present disclosure are illustrated.

FIG. 3B schematically shows a perspective view of the MOS device 20 of FIG. 3A, where only some elements useful for the present discussion are illustrated. In particular, FIG. 3B illustrates a possible conformation of the gate region 28, which is formed by filling a trench etched in the epitaxial layer 22. The trench has, as can be seen, a strip shape, i.e. an elongated (finger-like) shape, with main extension along the Y axis; the trench is delimited internally, as better described later with reference to the manufacturing steps, by a bottom 40', by side walls 40", which are the walls of greater extension, parallel to the YZ plane, and by walls 40''' parallel to the plane XZ (orthogonal to plan YZ), connecting together the side walls 40". The section of FIG. 3A is taken along the section line A-A of FIG. 3B, while the section of FIG. 3C, described below, is taken along the section line C-C of FIG. 3B. The view of FIG. 3C is therefore taken along a plane orthogonal to the section of FIG. 3A.

Figure 3C:
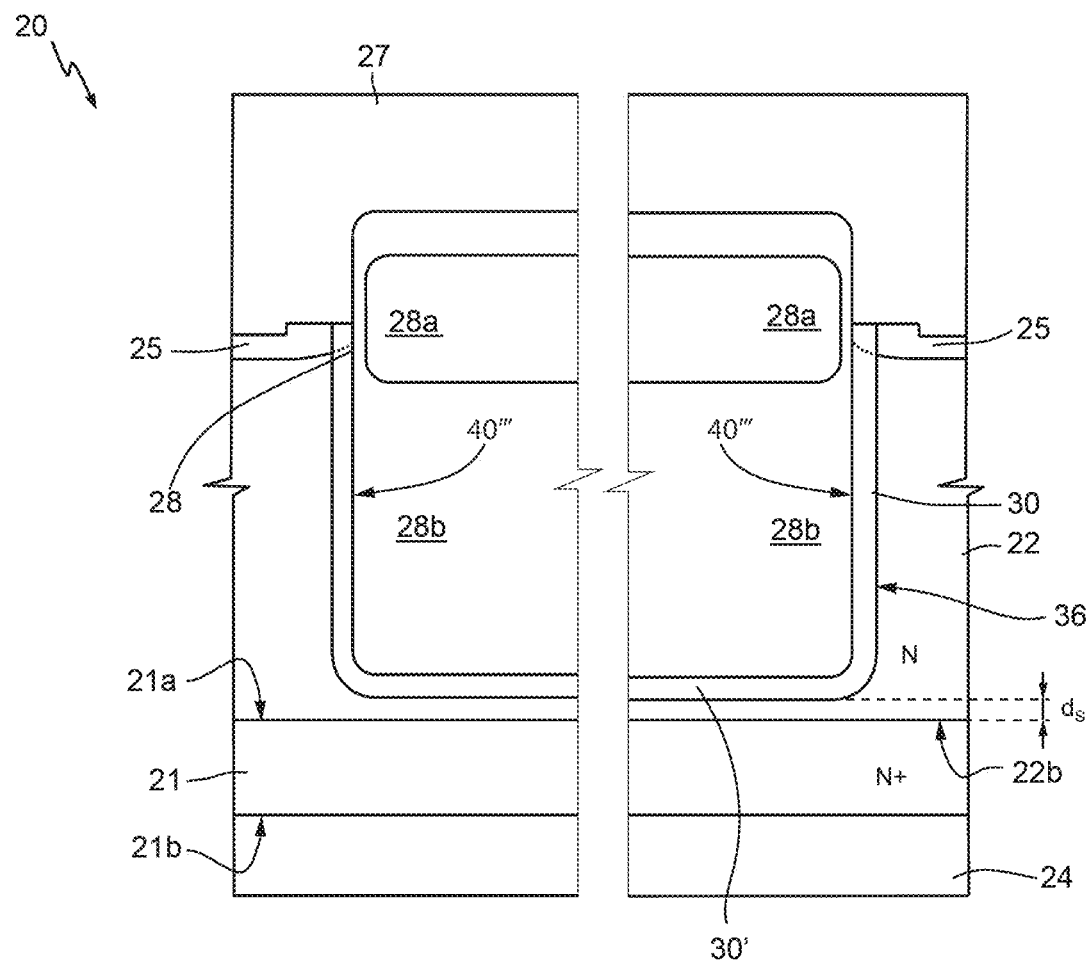
FIG. 3C is a cross-sectional view, along the section line C-C of FIG. 3B, of the MOS device of embodiments of the present disclosure.

FIG. 3C illustrates a sectional view along the YZ plane of the gate region 28. As can be seen from FIG. 3C, in correspondence of the walls 40''' (i.e. at the end of the gate region 28) the region 36, and in particular the columnar region 30, extends along the Z axis until it reaches the surface 22a, in correspondence with the body region 25. Here, the columnar region 30 "enters" the body region 25 (and vice versa). Columnar region 30 and body region 25 are, in other words, in direct electrical connection, i.e. they are electrically connected to each other in the absence of an intermediate electrical-connection region.

The walls 40''' extend at a peripheral area of the MOS device 20, outside the active area. At walls 40''' the body region does not house source regions, since this peripheral area of the MOS device 20 is not designed to participate to the electrical conduction (i.e., the absence of the source region means that there can be no current transfer between source and drain in such peripheral area).

The regions 36 of the MOS device 20 of FIG. 3 are obtained as described hereinafter and represented in FIGS. 4-12 only with respect to a region 36, for simplicity of representation.

Figure 4:
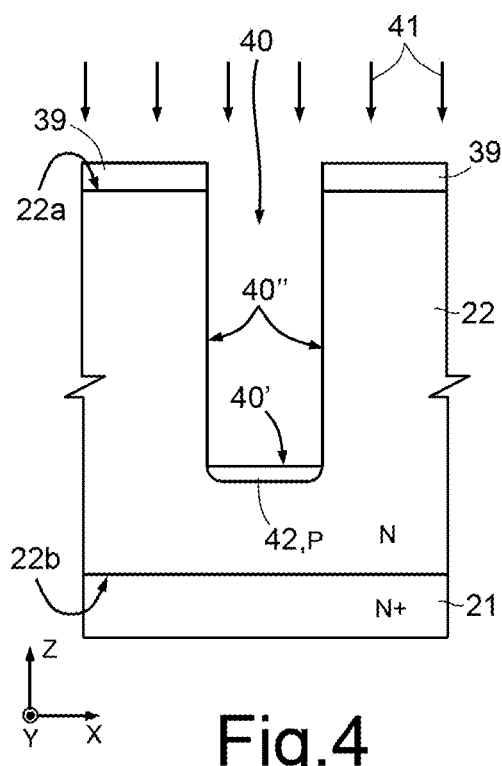
FIGS. 4-12 are cross-section views of a portion of the device of embodiments of the present disclosure, in successive manufacturing steps.
Figure 5:
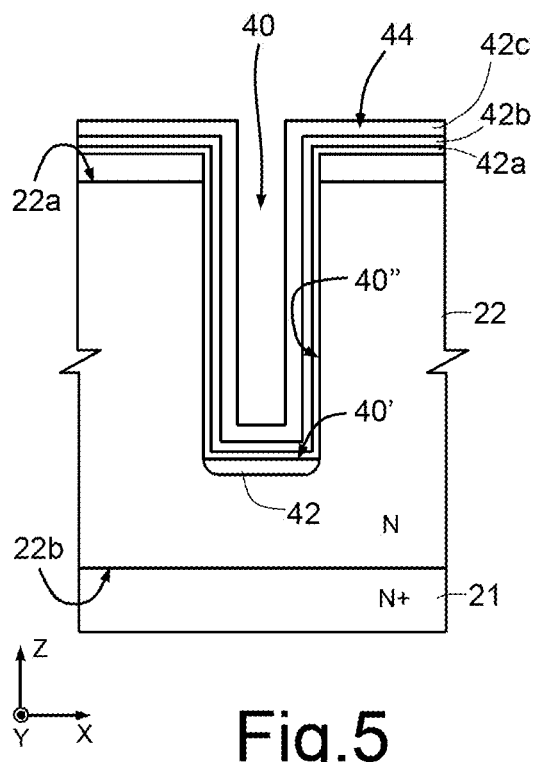

With reference to FIG. 4, after growth of the epitaxial layer 22 on the substrate 21 of a semiconductor wafer (not illustrated in its entirety), a step of masked etching is carried out (using a mask 39, for example of $SiO_2$) to form a trench 40 in the epitaxial layer 22. The trench 40 (which, at the end of the manufacturing steps, will form the trench gate) is delimited by a bottom 40' and by side walls 40". The bottom 40' terminates at a distance from the substrate 21.

Using the same mask 39, an implantation of dopant species of a P type (e.g., boron, represented by the arrows 41) is then carried out so as to locate the dopant species at the bottom 40' of the trench 40, to form an implanted region 42 in the epitaxial layer 22.

Then (FIG. 5), using the same mask 39, a step of formation of a multilayer 44 in the trench 40 is carried out so as to completely cover the side walls 40" and the bottom 40' of the trench 40. The multilayer 44 includes a first oxide layer 44a, a layer of silicon nitride ($Si_3N_4$) 44b on the first oxide layer 44a, and a second oxide layer 44c on the silicon-nitride layer 44b. In particular, the first oxide layer is grown or deposited by known techniques (e.g., thermal oxidation or CVD) until a thickness of some nanometers (e.g., 10 nm) is reached. The silicon-nitride layer 44b is deposited by known techniques (e.g., CVD) until a thickness of some nanometers (e.g., 20 nm) is reached. The second oxide layer 44c is deposited by known techniques (e.g., CVD) until a thickness of approximately 10-30 nm is reached.

Figure 6:
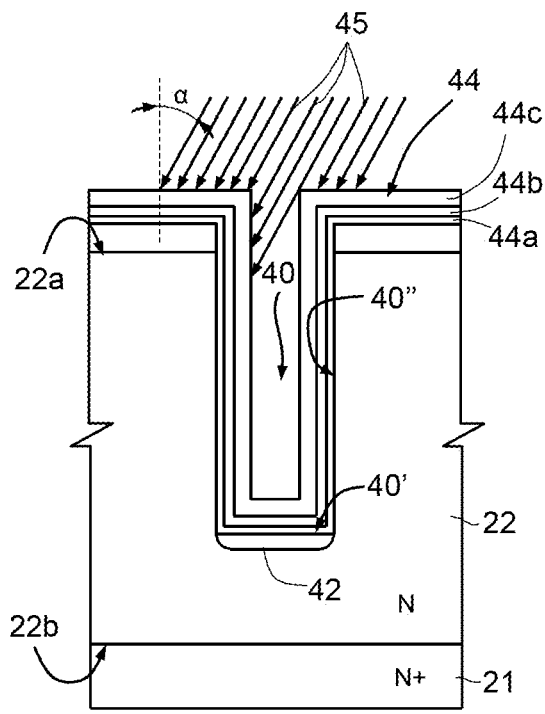

Then, FIG. 6, the wafer is subjected to a process of ion implantation (e.g., using heavy ions, such as As, Ar, etc.) with inclination a with respect to the side walls 40" of the trench 40. In this way, a beam of ions 45 impinges upon the multilayer 44 on a portion of the latter that extends along the side walls 40" in proximity of the top surface 22a of the epitaxial layer 22. In particular, the angle of inclination a is chosen so that the ions will impinge upon a region of the second oxide layer 44c that extends, starting from the surface 22a of the epitaxial layer 22, towards the bottom 40' of the trench 40, for approximately 1-2 μm. This extension corresponds substantially to the distance $d_E$.

The aforementioned process of ion implantation is carried out for both of the side walls 40" of the trench 40.

In addition, a similar process of ion implantation is optionally carried out on the bottom 40' of the trench 40.

The aforementioned implantation steps have the function of locally causing damage to the second oxide layer 44c; for this purpose, the implantation conditions are chosen in an appropriate way to create damage at a molecular-bond and stoichiometric level to the second oxide layer 44c, in order to facilitate removal thereof in a subsequent step. By way of example, the implantation energy is comprised in the range between 20 and 40 keV, and the implantation process is carried out at a temperature in the range between 30 and 50° C.

Figure 7:
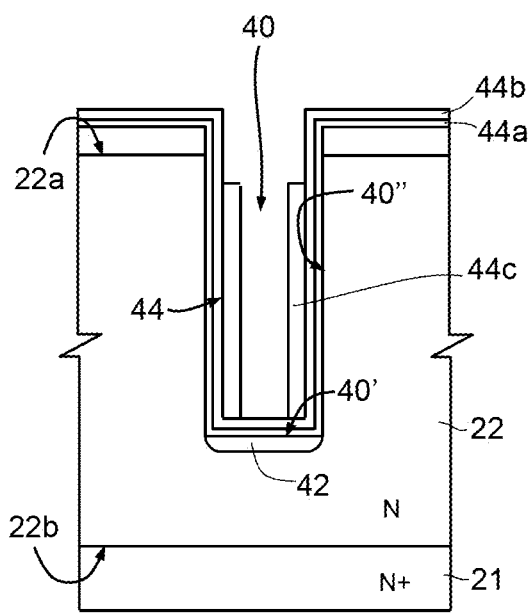

Then, FIG. 7, a step of (wet) chemical etching with HF or BHF vapor is carried out, which selectively removes the regions of the second oxide layer 44c that underwent implantation in the step of FIG. 6. In fact, the etch rate of the oxide that underwent implantation in the step of FIG. 6 is much higher than the corresponding etch rate of the oxide that did not undergo implantation in the step of FIG. 6 (it is possible to reach a ratio of 100:1 in HF vapor).

Selective regions of the silicon-nitride layer 44b that extend in the trench 40 in the proximity of the surface 22a and at the bottom of the trench are thus exposed.

It may be noted that since the implantation step of FIG. 6 is carried out in the absence of a mask, it also makes the portions of the oxide layer 44c that extend outside the trench 40 (on the front side of the wafer) selectively etchable. These outer portions are therefore also removed during the step of FIG. 7.

Figure 8:
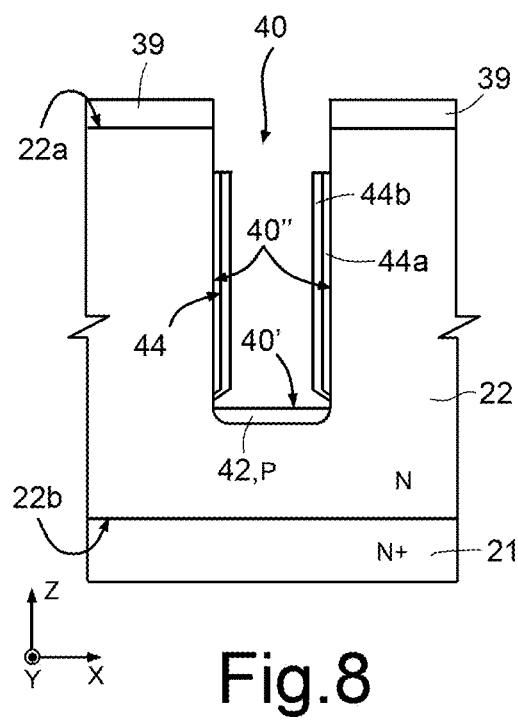
Figure 9:
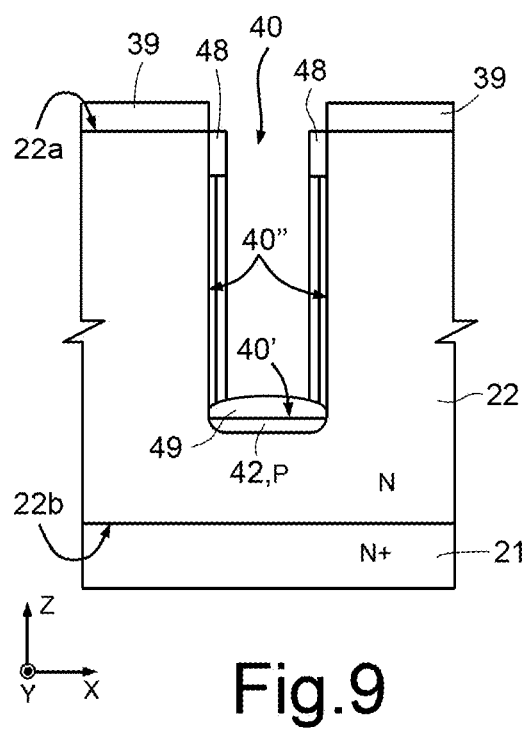

Next, FIG. 8, a further chemical etch is carried out to remove the silicon-nitride layer 44b, where exposed. This step may, for example, be carried out with a wet etch using $H_3PO_4$.

Then, an etching step (e.g., isotropic etching of a wet type) in HF is carried out to completely remove the second oxide layer 44c and the exposed part of the layer 44a. Within the trench 40 there thus remains a double layer 44a-44b that covers part of the side walls 44", without reaching the surface 22a of the epitaxial layer 22 and leaving the bottom 40' free. In particular, the epitaxial layer 22 is exposed in regions of the side walls 44" close to the surface 22a and to the bottom 40'. Next, FIG. 9, a step of thermal oxidation (e.g., by the LOCOS technique) enables growth of a respective protective layer 48, of silicon oxide, in the exposed regions of the epitaxial layer 22 within the trench 40 (i.e., between the surface 22a and the double layer 44a-44b). This protective layer 48 has a thickness, measured along X, for example comprised between 80 nm and 120 nm. A protective layer 49, similar to the layer 48, is likewise grown at the bottom 40' of the trench 40.

Figure 10:
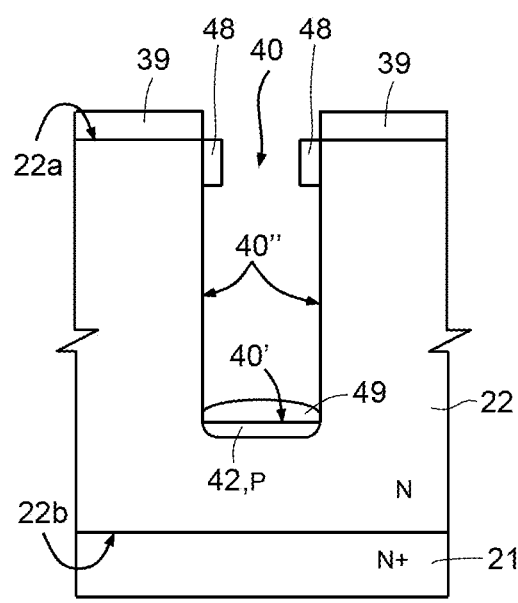

Then, FIG. 10, the double layer 44a-44b is completely removed by a double etching step that comprises an etch using $H_3PO_4$ for removing the layer 44b of $Si_3N_4$, and an etch using HF for removing the layer 44a of $SiO_2$. This second etch removes, in part, also the protective layer 48/49; however, given the greater thickness of the protective layer 48/49 with respect to that of the oxide layer 44a, complete removal of the oxide layer 44a does not have a significant impact on the protective layer 48/49. Through the trench 40, regions of the epitaxial layer 22 comprised between the protective layer 48 and the bottom 40' of the trench 40 are thus exposed.

Figure 11A:
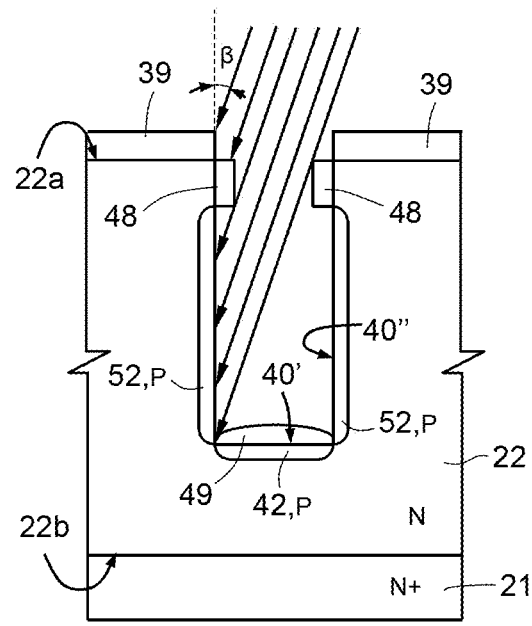

Next, FIG. 11A, a step of implantation of dopant species of a P type (e.g., boron) is carried out to form the columnar regions 30 at the portions of the side walls 40" not protected by the protective layer 48/49 (i.e., that extend between the protective layer 48 and the bottom 40' of the trench 40).

This implantation is carried out with an implantation angle β (inclination with respect to the side wall 40", on which the implantation takes place) of approximately 8°, and is repeated for both side walls 40" of the trench 40.

By way of example, the implantation energy is chosen in the range between 10 and 25 keV, and the implantation process is carried out at a temperature in the range between 3 and 20° C. There are thus formed, at both side walls 40" of the trench 40, implanted regions 52, each having a dopant concentration of between $10^{13}$ and $10^{14}$ cm$^{-2}$.

The protective layer 49 has the function of protecting, in this step of FIG. 11A, the bottom of the trench 40 from an undesirable implantation of dopant species deriving from a reflection of dopant ions that impinge upon the side walls 40" during implantation, but are not completely absorbed by the side walls 40", or are released by the side walls 40", in an undesirable way.

The implantation step of FIG. 11A can be replaced by further processes adapted to form doped regions, of a P type, of the type of the regions 52 of FIG. 11A, i.e., which extend in the epitaxial layer 22 along the side walls 40" of the trench 40, between the protective layer 48 and the bottom 40' of the trench 40. For instance, these further processes include, for example:

a process of diffusion of boron in the epitaxial layer 22 starting from a borosilicate glass (BSG) using the RTP (Rapid Thermal Processing) technique, as described by M. Miyake, "Diffusion of Boron into Silicon from Borosilicate Glass Using Rapid Thermal Processing", J. Electrochem. Soc. 1991, vol. 138, issue 10, 3031-3039;

a process of doping by PIII(Plasma-Immersion Ion Implantation); and a process of doping using the MLP (MonoLayer Doping) technique.

In the case where the step of FIG. 11A is replaced by the aforementioned processes, the steps that lead to formation of the protective layer 49 may be omitted; therefore, the protective layer 49 in this case is not formed.

Then, FIG. 11B, a further step of implantation of dopant species of type P (e.g., Boron) is carried out to form the columnar regions 30 also in correspondence of the walls 40''' that delimit the beginning and the end of trench 40 along the Y axis, as already discussed with reference to FIGS. 3B and 3C. The protection layer 48 is not present in correspondence of such walls 40''' of the trench 40 and therefore the implant covers the whole vertical surface of the walls 40''' between the bottom 40' and the surface 22a, in particular reaching the surface 22a without intermediate interruptions.

This implant is carried out with an angle of implantation (inclination with respect to the wall on which the implant takes place) similar to the angle β, in some embodiments equal or substantially equal to about 8°, and is repeated for both walls 40''' at the beginning and the end of trench 40. Alternatively, the implant may be performed at only one of the walls 40'''.

In some example embodiments, the implant energy is chosen in the range of 10-25 keV, and the implant process is performed at a temperature in the range of 3-20° C. Thus, at both walls 40''' of the trench 40, implanted regions 52' are formed, each having a concentration of dopant between $10^{13}$ and $10^{14}$ cm$^{-2}$.

The protection layer 49 has also in this case the function of protecting the bottom 40' of trench 40 from an undesired implant of dopant species resulting from a reflection of dopant ions impacting on the walls during the implantation. It is also noted that, in the case of implantation along the walls 40''', the bottom 40' of the trench 40 is no longer shaded and, in the absence of the protection layer 49, would be fully implanted.

The implantation step of FIG. 11B can, similarly to what is described with reference to FIG. 11A, be replaced by further procedures suitable to form doped regions, of P type, similar to the regions 52' of FIG. 11B, i.e. extending in the epitaxial layer 22 along the walls 40''', between the surface 22a and the bottom 40' of the trench 40. Such additional procedures include, for example:

a process of diffusion of boron in the epitaxial layer 22 starting from a borosilicate glass (BSG) using the RTP (Rapid Thermal Processing) technique, as described by M. Miyake, "Diffusion of Boron into Silicon from Borosilicate Glass Using Rapid Thermal Processing", J. Electrochem. Soc. 1991, vol. 138, issue 10, 3031-3039;

a process of doping by PIII (Plasma-Immersion Ion Implantation); and a process of doping using the MLP (MonoLayer Doping) technique.

Figure 12:
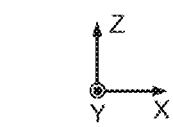

Finally, FIG. 12, the protective layers 48 and 49 and the mask 39 are completely removed.

There then follows a step of thermal treatment, or thermal annealing, to favor diffusion of the dopants of the implanted regions 42, 52, and 52', thus forming the region 36 described with reference to FIG. 3A and FIG. 3B.

Further steps of filling of the trench 40 by the gate dielectric region 28b and the gate conductive region 28a are carried out in a per se known manner and not described any further herein. The remaining steps of manufacture of the device 20 are likewise carried out (formation of the body region 25, the source region 26, etc.). These steps, in themselves known, are not described any further.

Figure 11B:
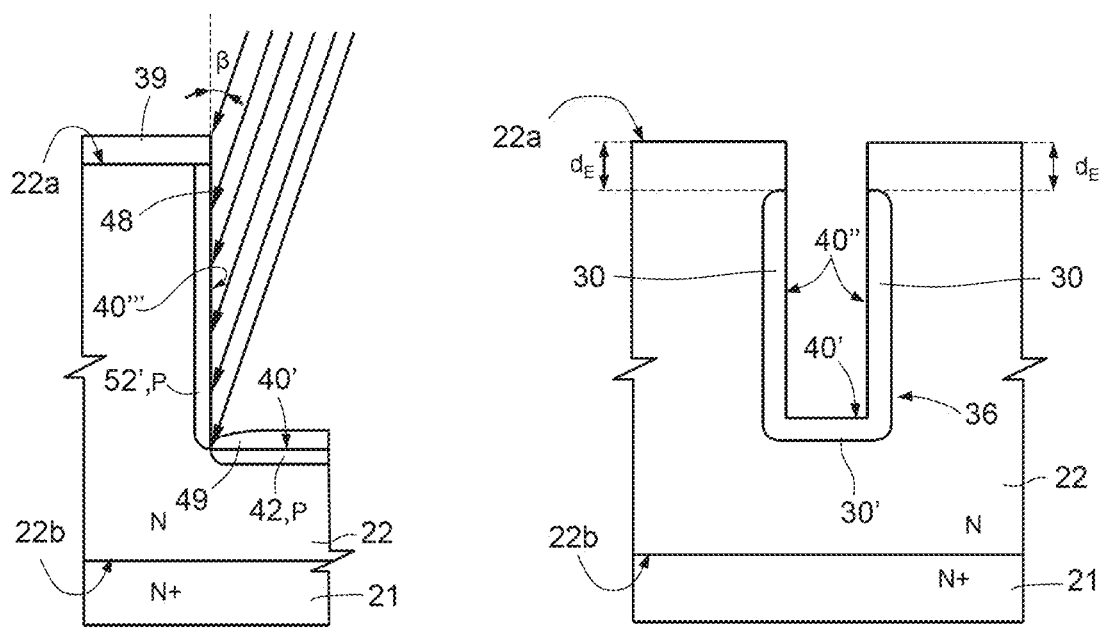
Figure 11B:
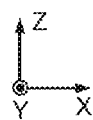

It may be noted that the step of annealing to form the region 36 can be carried out at the end of the manufacturing process so as to simultaneously activate all the dopants implanted in steps subsequent to that of FIG. 11A and FIG. 11B (e.g., the dopants of the body and/or source regions).

A step of formation of the metallization 27 enables formation of the MOS device 30 of FIG. 3A.

Figure 13:
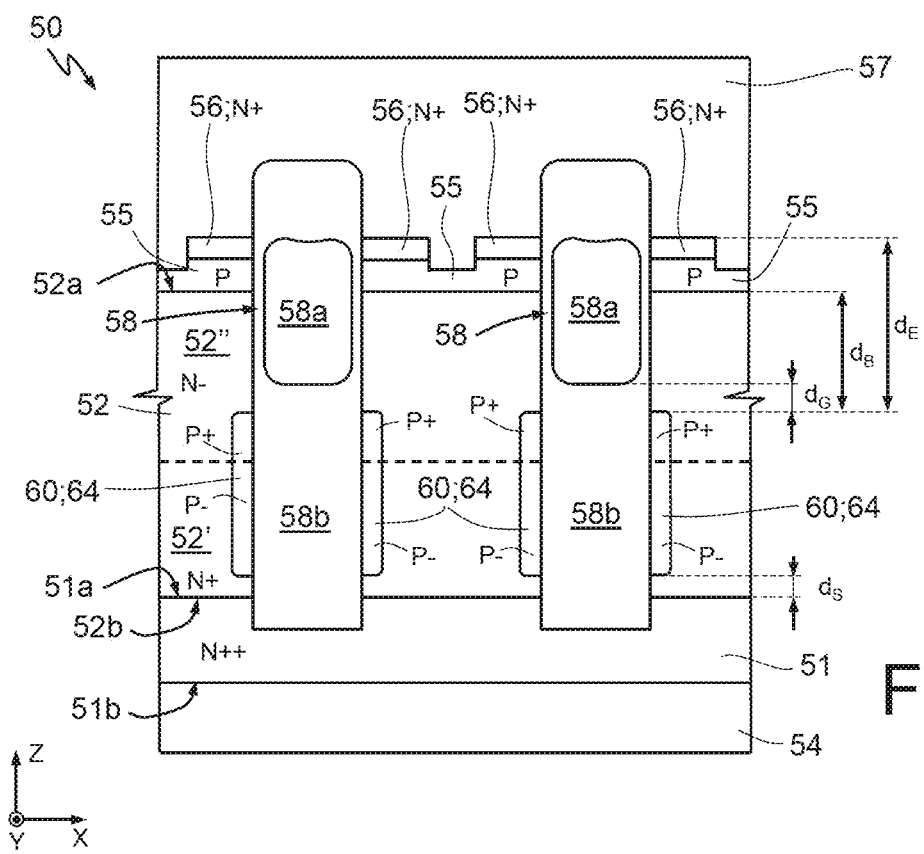
FIG. 13 is a cross-section view of a further example of an embodiment of a MOS device according to the disclosure.

FIG. 13 is a cross-section view in the triaxial reference system X, Y, Z, of a portion of a MOS device 50 of the charge-compensation type, according to a further embodiment of the present disclosure.

The MOS device 50 comprises a structural layer 52 (e.g., of silicon), of an N type overlying a substrate 51 of an N++ type (which is also, for example, of silicon). The structural layer 52 is formed by a first epitaxial layer 52', which extends over the substrate 51, and by a second epitaxial layer 52", which extends over the first epitaxial layer 52'. The first epitaxial layer 52' is of an N+ type, and the second epitaxial layer 52" is of an N− type. The doping density of the first epitaxial layer 52' is greater, by approximately 10%, than that of the second epitaxial layer 52". The structural layer 52 extends along the direction of the axis Z between a top surface or face 52a and a bottom surface or face 52b opposite to one another along Z. The thickness of the structural layer 52, measured along the direction Z between the top surface 52a and the bottom surface 52b is, for example, comprised between 6 μm and 14 μm. The thicknesses of the first and second epitaxial layers 52',52" are approximately the same as one another.

The bottom surface 52b is in direct contact with a top face 51a of the substrate 51, whereas a bottom face 51b of the substrate 51 (opposite to the face 51a along Z) is in contact with a drain metallization 54. Therefore, the substrate 51 and the drain metallization 54 together form a drain terminal of the MOS device 50.

The MOS device 50 further comprises one or more gate regions 58 (illustrated by way of example in FIG. 13 are two gate regions 58) of a trench type. In particular, the gate regions 58 each comprise a gate conductive region 58a completely surrounded by a respective dielectric layer 58b (which, at the gate conductive region 58a, forms the gate dielectric of the transistor). The gate conductive region 58a may, for example, be of metal material, or of doped polysilicon. The dielectric layer 58b is, for example, an oxide, such as $SiO_2$.

Each trench extends in depth in the structural body 52 through the entire thickness of the structural body 52 and partly penetrates into the underlying substrate 51, terminating within the substrate 51. It may be noted that only the dielectric layer 58b (and not the gate conductive region 58a) extends within the substrate 51.

Each trench that houses the respective gate region 58 has, by way of example, a depth, measured along the direction Z starting from the surface 52a, comprised between 4 and 10 μm and a width, measured along the direction X, comprised between 0.5 and 1.5 μm. The distance (also known as pitch) between a gate region 58 and the immediately subsequent (or previous) gate region 58 along the direction X is, for example, comprised between 1.2 and 4 μm.

In each gate region 58, the dielectric layer 58b extends in depth (along Z) in the structural layer 52 to completely cover the side walls and the bottom of the respective trench.

The thickness of each gate conductive region 58a, measured along the direction Z, is for example comprised between 0.4 and 1.1 μm. Each gate conductive region 58a extends between a top side thereof and a bottom side thereof. In one embodiment, the top side of each gate conductive region 58a is aligned to the surface 52a, so that the bottom side of each gate conductive region 58a reaches a depth, in the respective trench, comprised between 0.4 and 1.1 μm starting from the surface 52a. Body regions 55, of a P type, extend within the structural layer 52 alongside (along the direction X) each gate region 58 and facing the top surface 52a of the structural layer 52. The maximum depth, along the direction Z, reached by each body region 55 in the structural layer 52, measured in contact with the wall of the trench on which the body region 55 borders, is equal to or less than the depth reached by each gate conductive region 58a (i.e., in a non-limiting example, equal to or less than 0.4 to 1.1 μm).

The body regions 55 also house, in a per se known manner, source regions 56, of an N type, facing the top surface 52a.

An electrical-contact region (e.g., metallization region) 57 extends over the body region 25 and the source region 26, in electrical contact therewith, to bias them during use.

Columnar regions 60, of a P type, extend in the structural layer 52 (in particular, in the first and second epitaxial layers 52',52") laterally facing each gate region 58. In other words, the columnar regions 60 extend along sides, opposite to one another along the direction X, of each gate region 58. In particular, the columnar regions 60 border on, and are adjacent to, the dielectric layer 58b of the respective gate region 58. The columnar regions 60 extend at a distance (along Z) both from the overlying body regions 55 and from the underlying drain terminal (i.e., at a distance from the substrate 51).

Each of the columnar regions 60 extends partly in the first epitaxial layer 52' and partly in the second epitaxial layer 52". The portion of the columnar regions 60 that extends in the first epitaxial layer 52' has a P− charge or doping (e.g., in the range $0.5 \cdot 10^{12}$ to $5 10^{12}$ $cm^{-2}$), whereas the portion of the columnar regions 60 that extends in the first epitaxial layer 52' has a P+ doping (e.g., 10% higher).

The presence of the first and the second epitaxial layers 52',52" enables increase of the average concentration throughout the entire epitaxy 52 as compared to the case where it was obtained with a single concentration. This enables reduction of the Ron, maintaining the value of BV unaltered. In addition, according to the embodiment of FIG. 13, since the gate dielectric layer 58b of the gate region 58 penetrates into the substrate 51, the columnar regions 60 are not connected to one another at the bottom of the gate region 58, as illustrated in FIG. 3A. According to the embodiment of FIG. 13, two columnar regions 60 extend along mutually opposite side walls of each gate region 58, at a distance both from the overlying body region and from the underlying drain region. Each columnar region 60 has a conductivity (P) opposite to the conductivity (N) of the structural layer 52 that completely contains the columnar region 60.

The distance $d_B$ in FIG. 13 (distance, measured along Z, between each columnar region 60 and the body region 55 above it) corresponds to the distance $d_B$ in FIG. 3A (distance, measured along Z, between each columnar region 30 and the body region 25 above it); consequently the same considerations and sizings, discussed previously, apply.

Likewise, also the distance $d_E$ in FIG. 13 (distance, measured along Z, between each columnar region 60 and the top surface 52a of the structural layer 52) corresponds to the distance $d_E$ in FIG. 3A (distance, measured along Z, between each columnar region 30 and the top surface 22a of the epitaxial layer 22), and consequently the same considerations and sizings, discussed previously, apply.

The distance $d_G$ in FIG. 13 indicates, as already described for FIG. 3A, the gap (measured along Z) between each columnar region 60 and the bottom side of the gate conductive region 58a. By way of example, $d_G$ is comprised in the range between 0.4 and 0.8 µm. The distance $d_B$ has a value equal to or higher than that of $d_G$.

The distance ds in FIG. 13 denotes the distance, along Z, between the bottom of each columnar region 60 and the top surface 51a of the substrate 51, and has a value comprised, for example, between 0.4 µm and 0.8 µm. The choice of the value of the distance ds is in general made so as to guarantee, in use, the depletion of the region of the structural layer 52 that is comprised between each columnar region 30 and the substrate 51 (besides, as will be evident to the person skilled in the art, if the columnar regions 60 were too close to the substrate 51—drain terminal—there would be an undesirable drastic drop in the breakdown value).

The MOS device 50 is manufactured in a way similar to what has been described with reference to FIGS. 4-12 for the MOS device 30.

Formation of the structural region 52 envisages a dual epitaxial growth, with respective doping. Formation of the columnar regions 60 is obtained according to the process of FIGS. 14A and 14B, which illustrate the structural layer 52 in an intermediate manufacturing step, which has a trench 70 having a bottom 70' and side walls 70". The trench 70 houses a protective layer 48 formed according to what has been described with reference to FIGS. 5-10 and therefore identified by the same reference number.

In particular, two successive implantations are carried out, where a first implantation of dopant species of a P type (e.g., boron) is carried out (FIG. 14A) so as to form an implanted region 72, with doping P−, at portions of the side wall 70" of the trench 70 where it is desired to form the columnar regions 60.

The implantation angle γ (angle between the direction of implantation indicated by the arrows 74 and the side wall 70" where the implantation is carried out) is chosen appropriately and in a way in itself evident to the person skilled in the art, in order to respect the constraints described previously for the distances $d_B$, $d_G$, $d_E$, and ds. The implantation is carried out for both of the side surfaces 70" of the trench 70.

Then (FIG. 14B), a second implantation of dopant species of a P type (e.g., boron) is carried out, with an angle δ>γ defined as the angle between the direction of implantation indicated by the arrows and the side wall 70" where the implantation is carried out. The angle δ is chosen in an appropriate way in itself evident to the person skilled in the art in order to respect the constraints described previously for the distances $d_B$, $d_G$, $d_E$, and ds and implantation of dopant species of a P type exclusively at the second epitaxial layer 52" (i.e., where it is desired to form the P+ doped portion of the columnar regions 60).

Figure 14A:
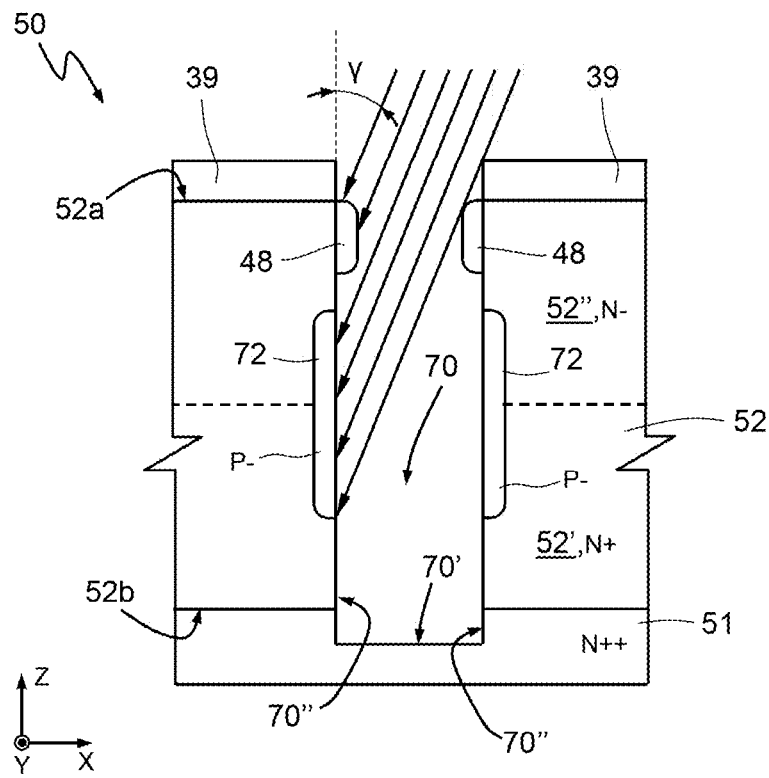
FIGS. 14A and 14B are cross-section views of one half of the device of FIG. 13, during intermediate manufacturing steps.
Figure 14B:
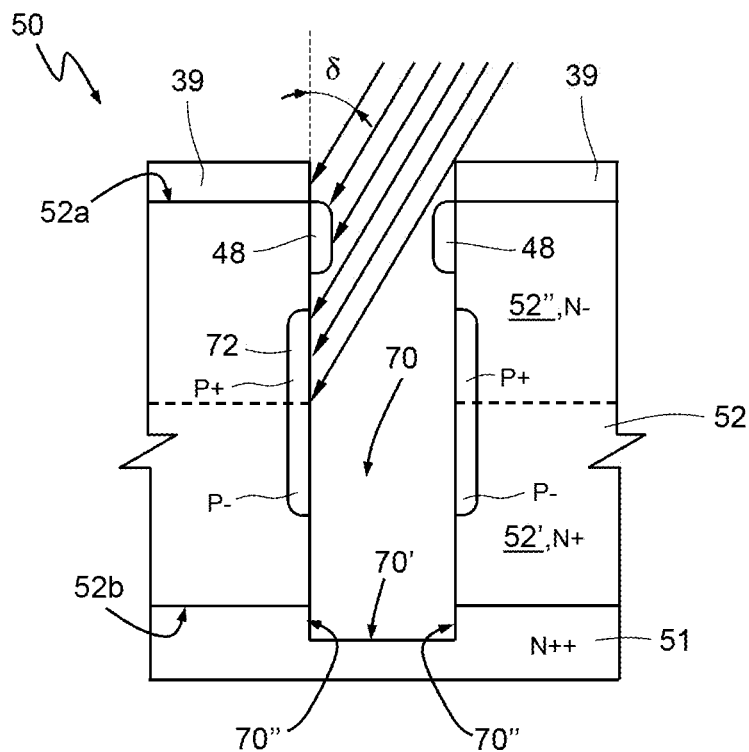

An annealing step enables activation and diffusion of the dopant species implanted in the steps of FIGS. 14A and 14B.

Finally, it is evident that modifications and variations may be made to the device and the manufacturing process described herein, without thereby departing from the scope of the present disclosure.

In particular, the protective layer 48 may be formed using techniques other than LOCOS oxidation, such as a non-conformable deposition technique using atomic-layer deposition (ALD) of $SiO_2$, or a non-conformable sputtering of $SiO_2$. Use of silicon oxide is advantageous as it can be selectively etched with respect to silicon and is easy to process; however, other materials may be used for the protective layer 48, such as $Si_3N_4$ or titanium. Moreover, the materials of the multilayer 44 may be different from the ones indicated, provided that the corresponding characteristics of selectivity to etching, described previously, are preserved.

Moreover, even though the present disclosure has been described with explicit reference to silicon as semiconductor material, other semiconductor materials may be used for manufacturing the MOS devices 20, 50, such as SiC.

The advantages afforded by the present disclosure emerge clearly from the foregoing description.

In particular, the presence of the regions 30, 60 prevents any degradation of the BV.

Figure 1:
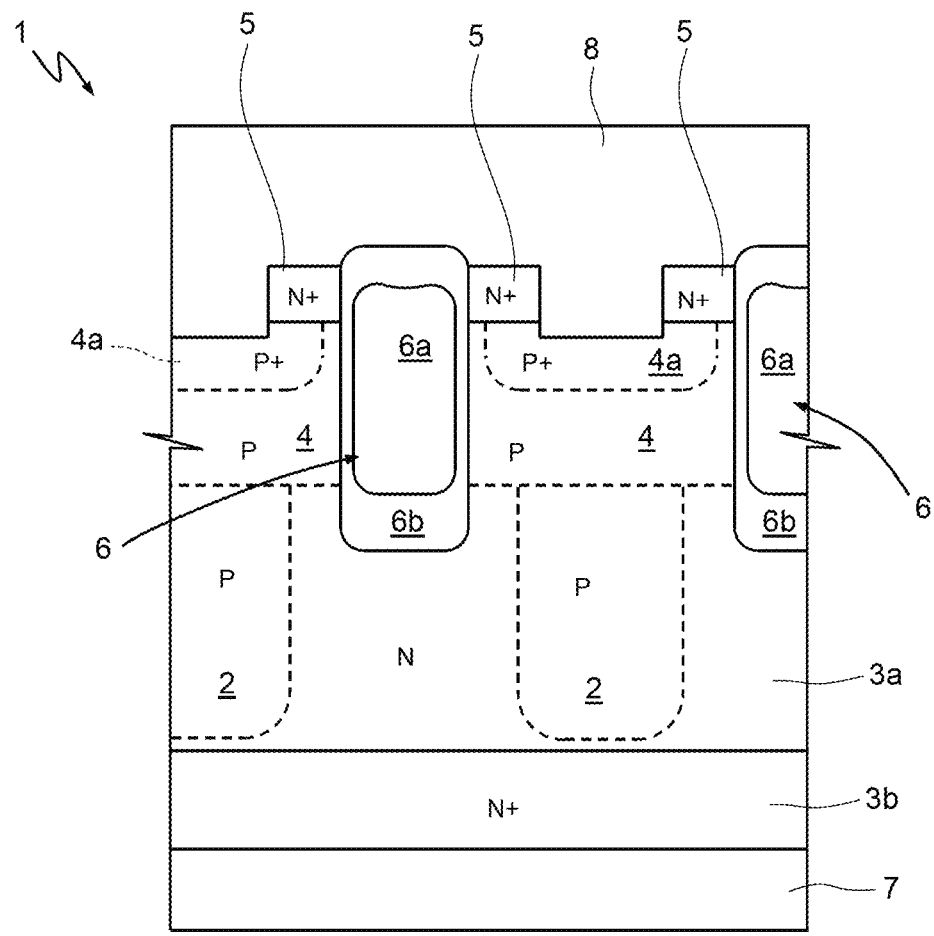
FIGS. 1, 2A, and 2B are respective cross-section views of known power MOS devices.
Figure 2A:
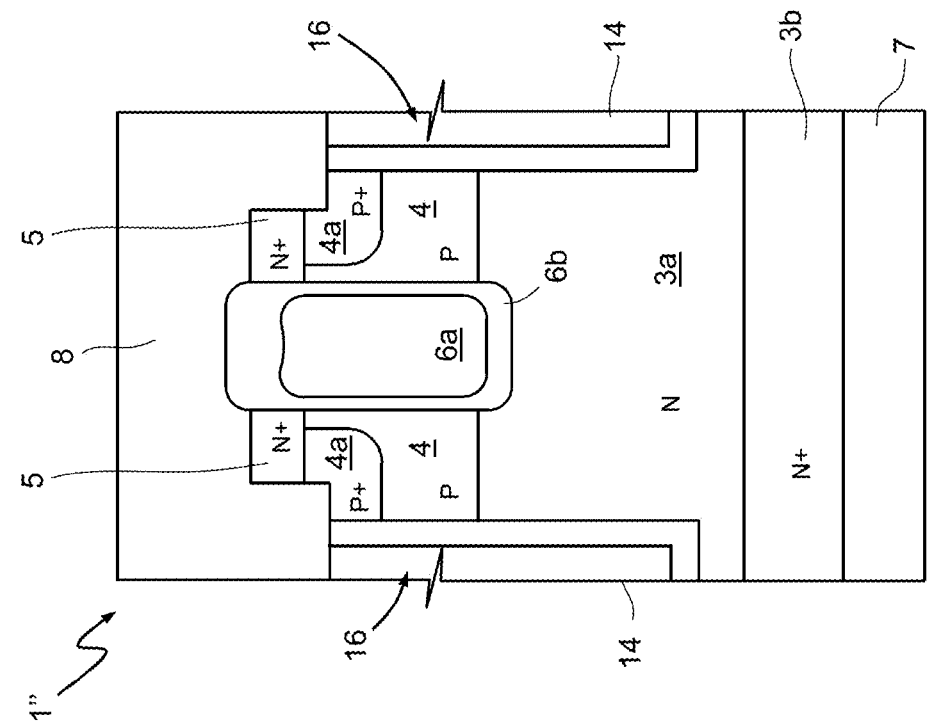
Figure 2B:
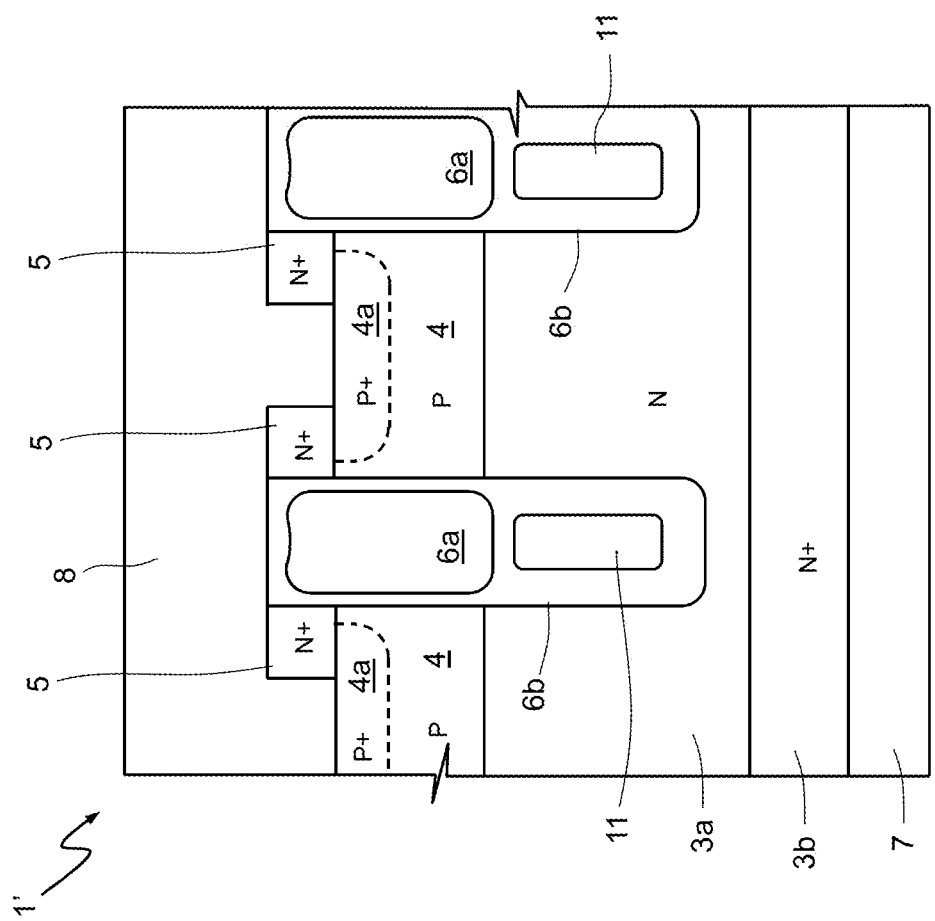

Moreover, the technical difficulties identified previously with reference to FIGS. 2A and 2B are overcome.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A charge-balance power device, comprising:
a semiconductor body having a first conductivity type, the semiconductor body having a first surface and a second surface opposite to one another along a direction;
a trench gate extending in the semiconductor body from the first surface towards the second surface;
a body region having a second conductivity type opposite to the first conductivity type, the body region facing the first surface of the semiconductor body and extending on a first side, a second side, and a third side of the trench gate, the first side and the second side being parallel to one another, the third side being transverse to the first and second sides;
source regions having the first conductivity type extending in the body region and facing the first surface;
a drain terminal extending on the second surface of the semiconductor body;
a first and a second columnar region having the second conductivity type and extending in the semiconductor body adjacent to said first and said second sides, respectively, of the trench gate, the first and second columnar regions spaced apart from the body region and from the drain terminal, the first and second columnar regions electrically disconnected from the body region; and
a third columnar region having the second conductivity type and extending in the semiconductor body adjacent to said third side of the trench gate, the third columnar region in direct electrical connection with the body region at said third side of the trench gate.

2. The charge-balance power device according to claim 1, wherein the body region further extends on a fourth side of the trench gate that is parallel to the third side, the device further including a fourth columnar region having the second conductivity type and extending in the semiconductor body adjacent to said fourth side of the trench gate, the fourth columnar region in direct electrical connection with the body region at said fourth side of the trench gate.

3. The charge-balance power device according to claim 2, wherein the fourth columnar region extends along the fourth side without interruption, until it reaches the first surface.

4. The charge-balance power device according to claim 1, wherein the third columnar region extends along the third side of the trench gate without interruption, until it reaches the first surface.

5. The charge-balance power device according to claim 1, wherein the source regions extend in the body region only at the first and second sides of the trench gate.

6. The charge-balance power device according to claim 1, wherein said first and second columnar regions are spaced apart from the body region by a first distance that is between 0.6 µm and 1.8 µm along the direction, and are spaced apart from the drain terminal by a second distance that is between 0.4 µm and 0.8 µm along the direction.

7. The charge-balance power device according to claim 1, wherein said first and second columnar regions are spaced apart from the first surface of the semiconductor body by a distance that is between 1 µm and 2 µm along the direction.

8. The charge-balance power device according to claim 1, wherein the trench gate includes a gate conductive region and a gate dielectric layer which completely surrounds the gate conductive region, said first and second columnar regions extending adjacent to the gate dielectric layer and being separated from the gate conductive region by said gate dielectric layer.

9. The charge-balance power device according to claim 8, wherein the gate conductive region extends from the first surface of the semiconductor body towards the second surface to a first depth in the semiconductor body along said direction, said first and second columnar regions extending from a second depth in the semiconductor body along said direction, the second depth greater than said first depth.

10. The charge-balance power device according to claim 9, wherein a difference between the second depth and the first depth is between 0.4 µm and 0.8 µm.

11. The charge-balance power device according to claim 2, wherein said first, second, third, and fourth columnar regions are mutually specular with respect to an axis of symmetry passing through a geometrical center of said trench gate.

12. The charge-balance power device according to claim 1, wherein said trench gate terminates within the semiconductor body at a distance from the drain terminal, the charge-balance power device further comprising a connection region having the second conductivity type, the connection region buried in the semiconductor body on a bottom side of said trench gate and in electrical connection with said first and second columnar regions, the connection region spaced apart from the drain terminal.

13. The device according to claim 1, wherein the drain terminal comprises a substrate of semiconductor material having the first conductivity type extending in contact with the second surface of the semiconductor body, and a drain metallization which extends in electrical contact with the substrate, wherein said trench gate completely passes through the semiconductor body and terminates within the substrate.

14. The device according to claim 13, wherein said semiconductor body includes a first epitaxial region which extends in contact with the substrate and having a first doping concentration, and a second epitaxial region extending over the first epitaxial region and having a second doping concentration lower than the first doping concentration, said first and second columnar regions extending in the first and in the second epitaxial regions and having a third doping concentration in the first epitaxial region and a fourth doping concentration, higher than the third doping concentration, in the second epitaxial region.

15. A process for manufacturing a charge-balance power device, comprising:
    forming a trench gate in a semiconductor body having a first conductivity type and a first surface and a second surface opposite to one another along a direction, the trench gate extending from the first surface towards the second surface;
    forming a body region in the semiconductor body on a first side, a second side, and a third side of said trench gate, the first and second sides of the trench gate being parallel to one another, the third side being transverse to the first and second sides, the body region facing the first surface of the semiconductor body and having a second conductivity type opposite to the first conductivity type;
    forming, in the body region and facing the first surface, source regions that have the first conductivity type;
    forming a drain terminal on the second surface of the semiconductor body;
    forming, in the semiconductor body, adjacent to said first and second sides of the trench gate, a first and a second columnar region having the second conductivity type, the first and second columnar regions spaced apart from the body region and from the drain terminal, the first and second columnar regions electrically disconnected from the body region; and
    forming a third a third columnar region having the second conductivity type, in the semiconductor body adjacent to said third side of the trench gate, the third columnar region in direct electrical connection with the body region at said third side of the trench gate.

16. The process according to claim 15, wherein the body region is further formed facing the first surface at a fourth side of said trench gate that is parallel to the third side, the process further including:
    forming a fourth columnar region having the second conductivity type, in the semiconductor body adjacent to said fourth side of the trench gate, the fourth columnar region in direct electrical connection with the body region at said fourth side of the trench gate.

17. The process according to claim 16, wherein the fourth columnar region is formed along the fourth side without interruption, until it reaches said first surface.

18. The process according to claim 15, wherein the third columnar region is formed along the third side without interruption, until it reaches said first surface.

19. The process according to claim 15, wherein the forming the source regions includes forming the source regions exclusively at said first and second sides of the trench gate.

20. The process according to claim 15, wherein the forming said first and second columnar regions comprises:
    forming, in the semiconductor body, a trench extending from the first surface towards the second surface;
    forming a mask on side walls of the trench;
    exposing portions of the semiconductor body in the trench by removing portions of the mask in the proximity of the first surface;
    forming a protective region on the exposed portions of the semiconductor body in the trench, said protective region being selectively etchable with respect to the mask;

removing said mask and exposing portions of the semiconductor body in the trench not covered by the protective region; and introducing dopant species having the second conductivity type in the semiconductor body, through the trench and on the portions of the semiconductor body not covered by the protective region.

21. The process according to claim 20, wherein the forming the mask comprises forming a multilayer mask including a first mask layer extending in contact with the semiconductor body in the trench, a second mask layer on the first mask layer, and a third mask layer on the second mask layer, wherein the first and the third mask layers are selectively removable with respect to the second mask layer, the removing portions of the mask layer and forming the protective region comprising:

removing portions of the third mask layer in the proximity of the first surface to expose portions of the second mask layer;

exposing respective portions of the first mask layer by removing the portions of the second mask layer previously exposed;

exposing respective portions of the semiconductor body in the trench by removing the third mask layer and the portions of the first mask layer previously exposed; and forming the protective region by local oxidation of the portions of the semiconductor body previously exposed.

22. The process according to claim 21, wherein the introducing dopant species into the semiconductor body through the trench includes one of the following:

a tilted implantation of dopant species having the second conductivity type;

a process of diffusion of dopant species having the second conductivity type starting from a borosilicate glass and by rapid annealing;

a process of doping by plasma-immersion ion implantation; and a process of doping using the monolayer doping technique.

23. A device, comprising:

a substrate having a first conductivity type, the substrate having opposite first and second surfaces;

an epitaxial layer on the first surface of the substrate, the epitaxial layer having the first conductivity type;

a trench gate extending into the epitaxial layer toward the substrate;

first and second columnar regions on opposite sides of the trench gate in the epitaxial layer and spaced apart from the first surface of the substrate, the first and second columnar regions having a second conductivity type opposite the first conductivity type, the first and second columnar regions electrically disconnected from the body region.

24. The device according to claim 23, further comprising a body region on the epitaxial layer and abutting sides of the trench gate, the body region having the second conductivity type.

25. The device according to claim 24, further comprising:

source regions on the body region and adjacent to sides of the trench gate, the source regions having the first conductivity type; and a drain metallization on the second surface of the substrate.

26. The device according to claim 23, further comprising a connection region on the trench gate and disposed between the trench gate and the substrate, the connection region electrically coupling the first and second columnar regions to one another, the connection region having the second conductivity type.

* * * * *